(12) United States Patent
Chen et al.

(10) Patent No.: US 7,476,564 B2
(45) Date of Patent: Jan. 13, 2009

(54) FLIP-CHIP PACKAGING PROCESS USING COPPER PILLAR AS BUMP STRUCTURE

(75) Inventors: Chien-Fan Chen, Kaohsiung (TW); Yi-Hsin Chen, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 394 days.

(21) Appl. No.: 11/320,786

(22) Filed: Dec. 30, 2005

(65) Prior Publication Data
US 2007/0052109 A1   Mar. 8, 2007

(30) Foreign Application Priority Data
Sep. 8, 2005   (TW) ............................... 94130921 A

(51) Int. Cl.
*H01L 21/00* (2006.01)
*H01L 23/48* (2006.01)
*B23K 31/02* (2006.01)

(52) U.S. Cl. ...................... 438/107; 438/108; 438/612; 438/613; 228/178; 228/180.1; 228/180.21; 228/180.22; 257/737; 257/762; 257/779; 257/780; 257/E23.021

(58) Field of Classification Search .................. 438/106, 438/108
See application file for complete search history.

(56) References Cited

U.S. PATENT DOCUMENTS

| | | | |
|---|---|---|---|
| 6,281,107 B1 * | 8/2001 | Moriyama | 438/613 |
| 6,469,393 B2 * | 10/2002 | Oya | 257/779 |
| 6,713,235 B1 * | 3/2004 | Ide et al. | 430/313 |
| 7,208,834 B2 * | 4/2007 | Lee et al. | 257/737 |
| 2004/0126927 A1 * | 7/2004 | Lin et al. | 438/107 |
| 2006/0055032 A1 * | 3/2006 | Chang et al. | 257/734 |

FOREIGN PATENT DOCUMENTS

JP         02232946 A   *   9/1990

* cited by examiner

*Primary Examiner*—Alonzo Chambliss
(74) *Attorney, Agent, or Firm*—Muncy, Geissler, Olds & Lowe, PLLC

(57) ABSTRACT

A flip-chip packaging process is disclosed. The present invention is featured in forming a copper pillar on a wafer, forming a solder on a substrate; and enabling the solder to substantially cover the entire externally-exposed surface of the copper pillar, thereby connecting the copper pillar to the substrate. The copper pillar of the present invention can be such as a prism or a cylinder.

5 Claims, 4 Drawing Sheets

FLIP-CHIP PACKAGING PROCESS USING COPPER PILLAR AS BUMP STRUCTURE

RELATED APPLICATIONS

The present application is based on, and claims priority from, Taiwan Application Serial Number 94130921, filed Sep. 8, 2005, the disclosure of which is hereby incorporated by reference herein in its entirety.

FIELD OF THE INVENTION

The present invention relates to a flip-chip packaging process, and more particularly to the flip-chip packaging process using a copper pillar as a bump structure.

BACKGROUND OF THE INVENTION

Whenever an integrated circuit (IC) is fabricated, it still needs to be connected to other elements; implemented with heat dissipation function; and protected by a housing, and thus a semiconductor packaging process follows. Semiconductor package structures can be relatively simple or complicated, and the number of pins in a semiconductor package is rapidly increasing due to the increasing integration from the development of ultra large-scale integration (ULSI). Conventional package structures generally provide IC chips with protection, power, heat dissipation and connections to other elements, but the purpose of modern package structures is changed to enabling the packaged IC chips to be compatible with next-level packaging.

For dealing with the trend of 3C products towards shortness, smallness, lightness and thinness, the flip-chip technology has become one of the most important packaging technologies. In the flip-chip technology, the technique for fabricating solder bumps is quite critical to the connection performance of semiconductor devices.

Referring to FIG. 1A to FIG. 1C, FIG. 1A to FIG. 1C are schematic diagrams showing the structure of a conventional solder bump and the fabrication process thereof. Such as shown in FIG. 1A, a bond pad 30 is formed between a wafer 10 and a passivation layer 20, and an under bump metallurgy (UBM) layer 22 is formed over the passivation layer 20 and the bond pad 30. Thereafter, such as shown in FIG. 1B, a high lead solder 50 is formed on the bond pad 30 under via the blocking of a photoresist layer 40 by electroplating or printing. Then, the photoresist 40 and a portion of the UBM layer 22 thereunder are removed, and a reflow step is performed subsequently for melting and forming the high lead solder 50 as a spherical solder bump 60 shown in FIG. 1C.

Referring to FIG. 1D to FIG. 1F, FIG. 1D to FIG. 1F are schematic diagrams showing a conventional flip-chip packaging process. Such as shown in FIG. 1D, the wafer 10 having the solder bumps 60 is turned upside down with flux applied on the solder bumps 60, and then the solder bumps 60 are mounted on a substrate 70. Such as shown in FIG. 1E, a reflow step is then performed under the reflow temperature of 320° C. to melt the solder bumps 60 for being attached to the substrate 70. Thereafter, such as shown in FIG. 1F, due to large stress difference between the wafer 10 and the substrate 70, cracks are easily to be caused at junction surfaces, i.e. the solder bumps 60, so that an underfill material 80 is filled among the solder bumps for distributing the stress on the entire underfill material 80, thereby reducing the stress exerted on each of the solder bumps 60, thus promoting reliability, wherein the underfill material 80 can be such as epoxy resin.

However, since the etching selectivity between the solder bumps 60 and the UBM layer 22 is poor, the step of etching the UBM layer 22 is difficult to be controlled. Further, the strength and capacitance density of the solder bumps 60 are not sufficient for fabricating high-speed charging and discharging elements. In addition, the conventional process needs to use the reflow steps, thus making the entire process quite complicated.

Hence, there is a need to develop a flip-chip packaging process using a copper pillar as a bump structure for overcoming the conventional process's disadvantages of insufficient strength and capacitance density of the solder bumps; having difficulty in controlling the step for etching the UBM layer; and requiring the relfow steps.

SUMMARY OF THE INVENTION

Therefore, an aspect of the present invention is to provide a flip-chip packaging process for replacing solder bumps with copper pillars, thereby overcoming the shortcomings of insufficient strength and capacitance density of the solder bumps and requiring relfow steps, thus meanwhile benefiting the controllability of the step for etching the UBM layer.

The other aspect of the present invention is to provide a flip-chip packaging process for allowing a solder to cover substantially all of the external surfaces of a copper pillar.

According to the aforementioned aspects, a copper pillar is provided as a bump structure for replacing the conventional solder bump. According to a preferred embodiment of the present invention, in the flip-chip packaging process, a wafer is first provided, wherein a bond pad and a passivation layer are formed sequentially on the wafer, the passivation layer exposing a portion of the bond pad. An UBM layer is then formed over the bond pad and the passivation layer. Thereafter, a photoresist layer is formed on the UBM layer with an opening formed for exposing a portion of the UBM layer, and then a copper material is filled into the opening. Thereafter, the photoresist layer and the other portion of the UBM layer that is not covered by the copper material are removed, thereby forming a copper pillar having a plurality of external surfaces exposed to the ambience. On the other hand, a solder is formed on a substrate, and then the copper pillar is embedded in the solder, wherein the solder covers substantially all of the external surfaces of the copper pillar.

Hence, with the application of the present invention, a copper pillar having the features of high strength and high capacitance density is used as a bump structure for meeting the requirements of fabricating high-speed charging and discharging elements, and benefiting the controllability of the step for etching the UBM layer; no reflow steps are required, thus simplifying the processing steps; and the solder covers substantially all of the external surfaces of the copper pillar, thereby preventing the copper pillar from oxidation.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, which are given by way of illustration only, and thus are not limitative of the present invention, and wherein.

DETAILED DESCRIPTION OF THE PREFERRED EMBODIMENT

The present invention is featured in forming a copper pillar on a wafer; forming a solder on a substrate; and covering substantially all of the external surfaces of the pillar with the solder.

Figure 1A:
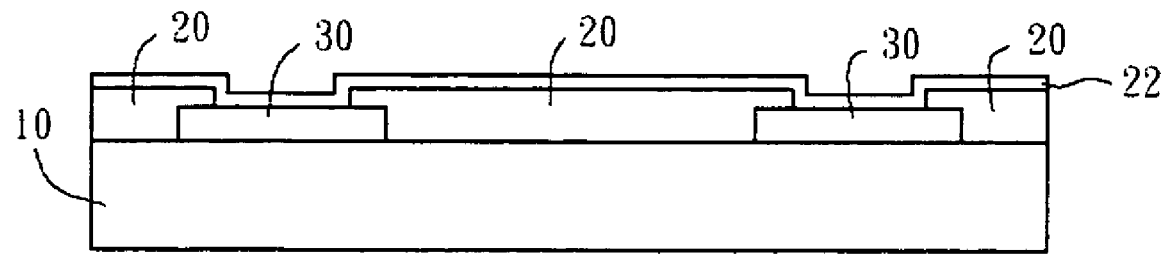
FIG. 1A to FIG. 1C are schematic diagrams showing the structure of a conventional solder bump and the fabrication process thereof.
Figure 1B:
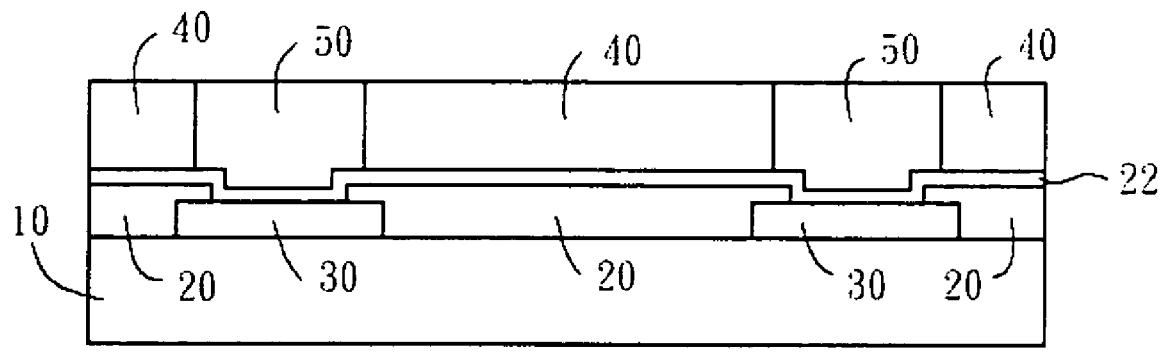
Figure 1C:
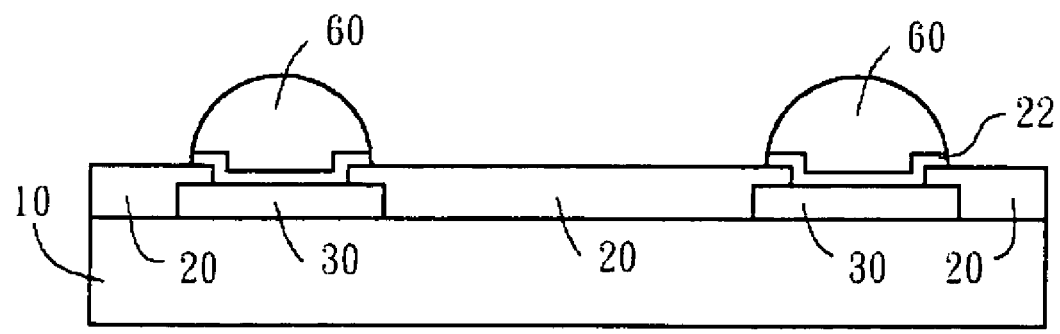
Figure 1D:
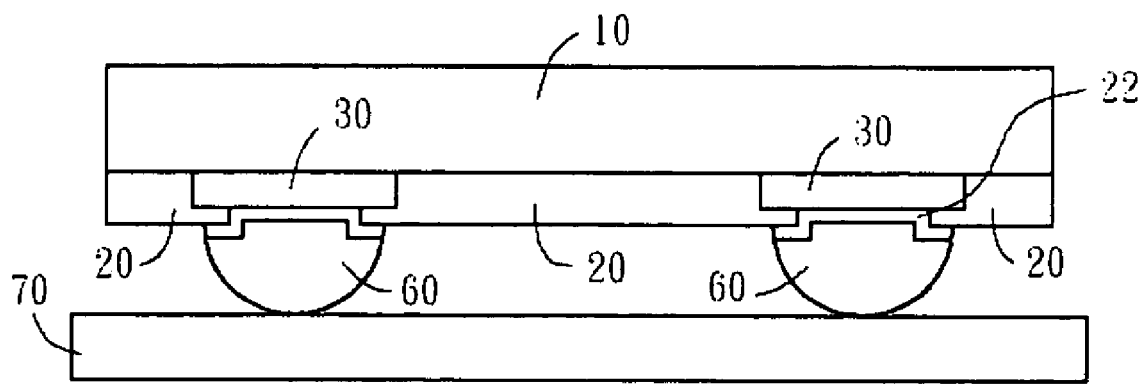
FIG. 1D to FIG. 1F are schematic diagrams showing a conventional flip-chip packaging process.
Figure 1E:
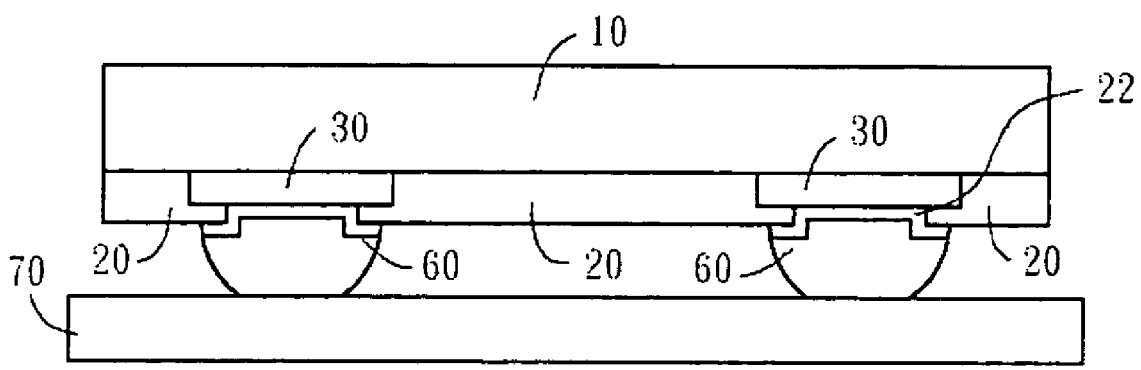
Figure 1F:
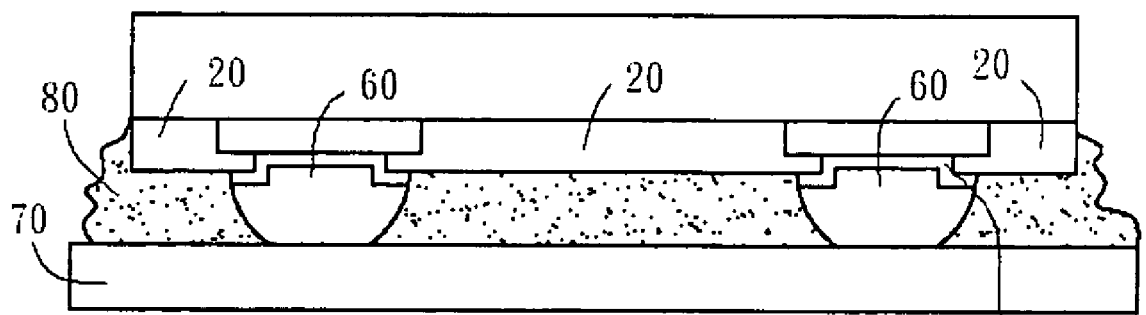
Figure 2A:
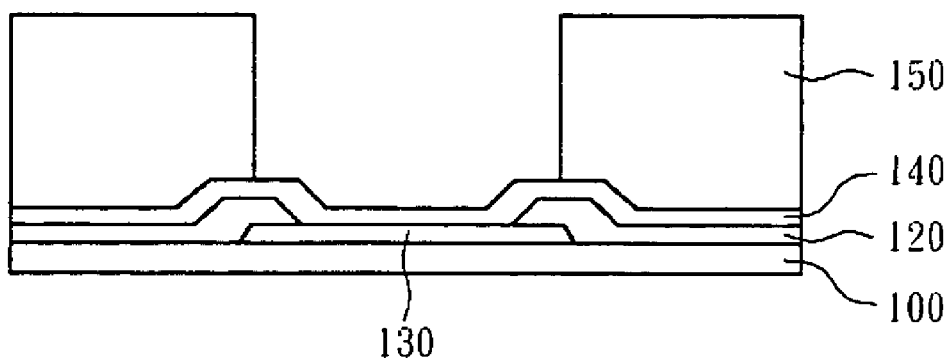
FIG. 2A to FIG. 2C are schematic diagrams showing the structure of a copper pillar and the fabrication process thereof in accordance with a preferred embodiment of the present invention.
Figure 2B:
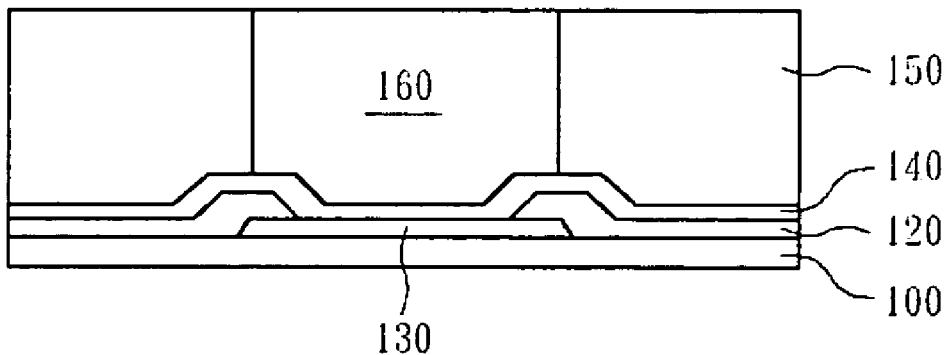
Figure 2C:
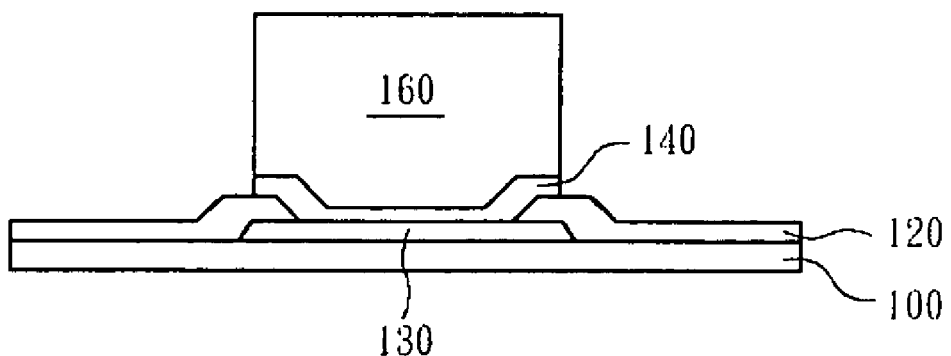

Referring to FIG. 2A to FIG. 2C, FIG. 2A to FIG. 2C are schematic diagrams showing the structure of a copper pillar and the fabrication process thereof in accordance with a preferred embodiment of the present invention. Such as shown in FIG. 2A, a bond pad 130 and a passivation layer 120 are first formed sequentially on a wafer 100, wherein the passivation layer 120 exposes a portion of the bond pad 130. Then, an UBM layer 140 is formed over the bond pad 130 and the passivation layer 120. Thereafter, a photoresist layer 150 is formed on the UBM layer 140 with an opening (not labeled) formed for exposing a portion of the UBM layer 140. Then, such as shown in FIG. 2B, a copper material 160 is filled into the opening. Thereafter, such as shown in FIG. 2C, the photoresist layer 150 and the other portion of the UBM layer 140 that is not covered by the copper material 160 are removed, thereby forming a copper pillar (i.e. the copper material 160) having a plurality of external surfaces exposed to the ambience at this point, wherein the shape of the copper pillar 160 can be such as a prism or a cylinder.

Figure 2D:
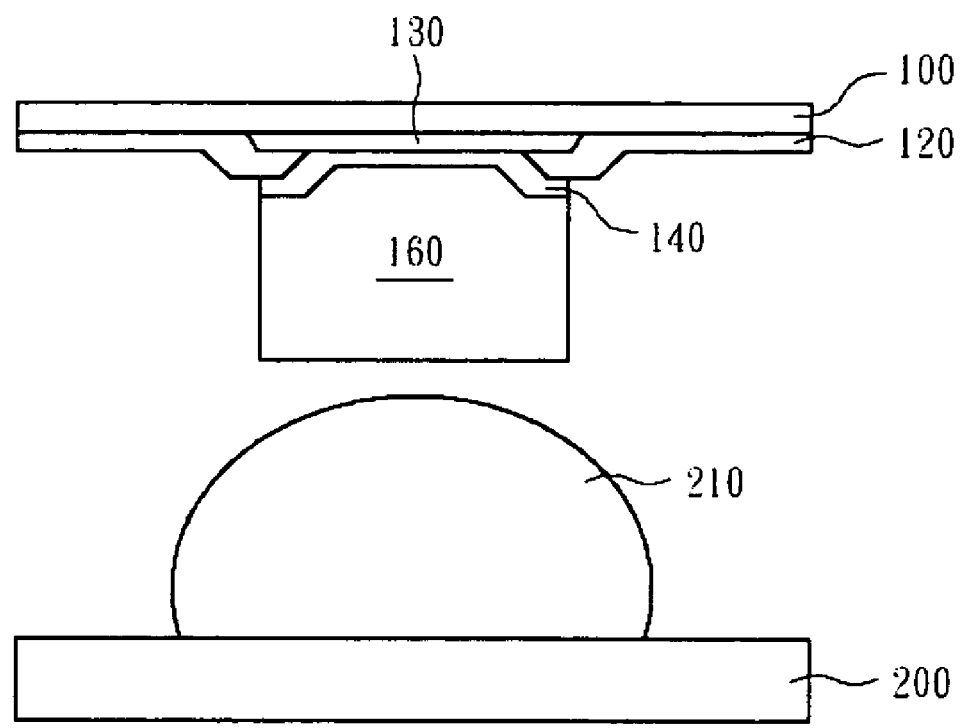
FIG. 2D to FIG. 2E are schematic diagrams showing a flip-chip packaging process in accordance with the preferred embodiment of the present invention.
Figure 2E:
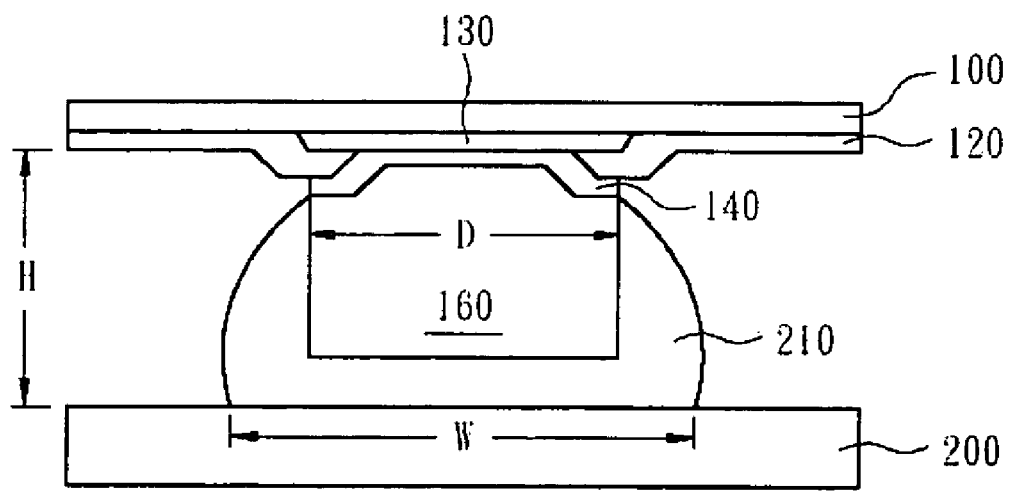

Referring to FIG. 2D to FIG. 2E, FIG. 2D to FIG. 2E are schematic diagrams showing a flip-chip packaging process in accordance with the preferred embodiment of the present invention. On the other hand, a solder 210 is formed on a substrate 200, and then the copper pillar 160 is embedded in the solder 210, wherein the solder 210 covers substantially all of the external surfaces of the copper pillar 160.

For convenience of explanation, only one single copper pillar 160 and its related structure are used in the above description, but actually, there are a plurality of copper pillars 160 formed on the wafer 100, and there are also a plurality of solders 210 formed on the substrate 200. For preventing two adjacent solders 210 from being connected to each other; and allowing the entire copper pillar 160 to be substantially covered with the solder 210, the UBM layer 120 is spaced from the substrate 200 at a distance from about 50 µm to about 75 µm, and the ratio of a width D of the copper pillar 160 to a bottom width W of the solder 210 placed on the substrate 200 is between about 0.1 and about 1.1. The aforementioned shape and size of the copper pillar, and the aforementioned distance between the wafer and the substrate are merely stated as examples for explanation, and can be adjusted or modified for meeting other requirements in accordance with the spirit of the present invention.

Since the copper pillar has the features of high strength and high capacitance density advantageously, the requirements of fabricating high-speed charging and discharging elements can be satisfied. The etching selectivity between the copper pillar and the UBM layer is good, so that the step of etching the UBM layer can be effectively controlled. In addition, the flip-chip packaging process of the present invention doe not need to use any reflow step, and thus the processing steps can be greatly simplified and the production time can be greatly reduced. It is worthy to be noted that the present invention is featured in covering about all of the originally exposed surfaces of the copper pillar with the solder, thus effectively preventing the surfaces of the copper pillar originally exposed to the ambience from oxidation.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A flip-chip packaging process, comprising:
   providing a wafer, wherein a bond pad and a passivation layer are formed sequentially on the wafer, the passivation layer exposing a portion of the bond pad;
   forming an under bump metallurgy (UBM) layer over the bond pad and the passivation layer;
   forming a photoresist layer on the UBM layer with an opening formed for exposing a portion of the UBM layer;
   filling a copper material into the opening;
   removing the photoresist layer and the other portion of the UBM layer that is not covered by the copper material, thereby forming a copper pillar having a plurality of external surfaces;
   forming a solder on a substrate; and
   embedding the copper pillar in the solder without a reflow step, wherein the solder covers substantially all of the external surfaces of the copper pillar.

2. The flip-chip packaging process according to claim 1, wherein the UBM layer is spaced from the substrate at a distance substantially from 50 µm to 75 µm.

3. The flip-chip packaging process according to claim 1, wherein the ratio of a width of the copper pillar to a bottom width of the solder placed on the substrate is substantially between 0.1 and 1.1.

4. The flip-chip packaging process according to claim 1, wherein the shape of the copper pillar is a prism.

5. The flip-chip packaging process according to claim 1, wherein the shape of the copper pillar is a cylinder.

* * * * *